United States Patent
Chang et al.

[11] Patent Number: 6,060,405
[45] Date of Patent: May 9, 2000

[54] METHOD OF DEPOSITION ON WAFER

[75] Inventors: Ru-Huei Chang, Taichung; Horng-Bor Lu, Hsinchu, both of Taiwan

[73] Assignee: United Microelectronics Corp., Hsin-Chu, Taiwan

[21] Appl. No.: 09/074,105

[22] Filed: May 7, 1998

[51] Int. Cl.$^7$ .................................................. H01L 21/469
[52] U.S. Cl. .................... 438/783; 438/758; 438/778; 438/782; 438/424; 118/326; 427/255.5
[58] Field of Search ........................... 438/758, 778, 438/783, 424, 782; 118/326; 427/255.5

[56] References Cited

PUBLICATIONS

IBM Technical Disclosure Bulletin. "Deposition Induced Self–Alignment Process", vol. 32, Issue 12, pp. 168–170, May 1, 1990.

*Primary Examiner*—Matthew Smith
*Assistant Examiner*—Renzo Rocchegiani
*Attorney, Agent, or Firm*—Thomas, Kayden, Horstemeyer & Risley

[57] ABSTRACT

A method of deposition with 4-PASS which is performed by a WJ-1000 or WJ-999 machine. Before each deposition is performed, it is necessary to turn the wafer an angle of 90° in the same direction. When deposition is this manner is performed four times on the same wafer, the uniformity in the four corners of the layer deposited on the 8-inch wafer can be improved. Over-polishing or recesses can be reduced and the kink effect can be prevented. 4-PASS deposition performed on the WJ-1000 or WJ-999 machine can make the uniformity within the wafer better and the yield of production can be increased.

15 Claims, 5 Drawing Sheets

METHOD OF DEPOSITION ON WAFER

CROSS-REFERENCE TO RELATED APPLICATION

This application claims priority benefit of Taiwan application Serial no. 87105970, filed Apr. 18, 1998, the full disclosure of which is incorporated herein by reference.

BACKGROUND OF THE INVENTION

1. Field of the Invention

The invention relates to a method of deposition on a wafer, and more particularly to a method of deposition on a wafer as applicable to the process of shallow trench isolation (STI), in which deposition is performed on a wafer with a machine WJ-1000 or WJ-999.

2. Description of the Related Art

STI is a general method for device isolation. It is often used to form shallow trenches between devices, after which a field oxide layer used to isolate devices is then formed by depositing an insulator. Referring to FIG. 1A, the formation of the field oxide region forms a pad oxide layer 10 and a silicon nitride layer 12 on a substrate 1. The substrate 1 is defined to form a STI by photolithography. Then, an oxide layer 14 used to isolate the devices is deposited over the substrate 1 and chemical mechanical polishing (CMP) is performed to planarize the STI to remove the excess portion of oxide layer 14. However as CMP is performed, a recess 15 occurs in the oxide layer 14a because the uniformity is not really good, as shown in FIG. 1B. The nitride layer 12 and the pad oxide layer 10 are then removed to accomplish a structure to serve as a field oxide region of device as illustrated in FIG. 1C.

In the process as described above, wet etching is used to remove the pad oxide layer 10, in which process hydrofluoric acid solution is employed as an etchant. During isotropic etching, the surface of the oxide layer 14b adjacent the substrate 10 is over-retched due to erosion by the hydrofluoric acid. A concave space 16 is thus produced at the sidewalls of the trench.

Additionally, a sacrificial oxide layer used to protect the surface of the substrate is typically formed over the surface of the substrate after forming the device isolation region. The sacrificial oxide layer is removed by hydrofluoric acid solution and overretching may still cause a concave space on the oxide layer adjacent to the surface of the substrate.

When the semiconductor device is completed, the accumulation of charges occurring in the concave space formed on the oxide layer adjacent to the substrate reduces the threshold voltage of the transistor and produces the abnormal sub-threshold current associated with the "kink effect". Occurrence of the kink effect impairs device and circuit performance and is thus undesirable.

In the prior art, the STI process is always performed in a 2-PASS procedure by a WJ-1000 or WJ-999 machine. FIG. 2 is a top view of a WJ-1000 or WJ-999 machine. Although the WJ-1000 or WJ-999 machine is able to use deposition to thoroughly cover wafers up to a size of 4, 5 or 6 inches, the WJ-1000 or WJ-999 machine cannot completely cover 8-inch wafers by deposition. Therefore the main deposition coverage 30 is centralized on the middle region of the wafer as shown in FIG. 3A, where the region beside the middle region is deposited as a thin region 32. As the 2-PASS process is performed on the 8-inch wafer, the deposition thickness for four corners on the wafer is especially thin such that the uniformity within the wafer is not quite superior. The thinner deposition corners 34 are as shown in FIG. 3B. This situation as described above exerts a huge influence in the following process. For example, the four corners are over-polished as CMP is finished and a serious recess, such as recess 14 in FIG. 1B, is thus produced on the wafer during the process of CMP. Similarly, the kink effect becomes more obvious and the yield of wafer production is lower. In the conventional 2-PASS deposition method, the error between the maximum and the minimum thickness detected with 49 probes by the WJ-1000 or WJ-999 machine is in a range of about 800–850 Å. Moreover, if a 1-PASS, 3-PASS or 5-PASS is performed, the uniformity becomes poor due to the asymmetrical, odd-numbered deposition. It is undesirable in the semiconductor process that the recess becomes more and more serious in subsequent CMP.

SUMMARY OF THE INVENTION

It is therefore an object of the invention to provide a method of deposition with a 4-PASS to perform shallow trench isolation process with a WJ-1000 or WJ-999 machine. The more symmetrical the method is, the better the uniformity within the wafer is during deposition of layers with a thickness of 7000 Å or more. Thus the recess produced by CMP and the kink effect due to concave spaces produced by over-etching can be prevented.

To achieve these objects and advantages, and in accordance with the purpose of the invention, as embodied and broadly described herein, the invention is directed towards a method of deposition with a 4-PASS which is performed by a WJ-1000 or WJ-999 machine. As shown in FIG. 4A, over half of the wafer is covered completely by a main deposition region 40, and each step of deposition produces the same kind of coverage. Next, a 4-PASS deposition is performed. Before each deposition, it is necessary to turn the wafer an angle of 90° in the same direction, after which deposition begins. This kind of deposition is performed four times on the same wafer. The thickness of the deposition layer on the wafer can be more uniform within the wafer because the method of deposition is symmetrical.

It is to be understood that both the foregoing general description and the following detailed description are exemplary and explanatory only and are not restrictive of the invention, as claimed.

DESCRIPTION OF THE PREFERRED EMBODIMENTS

Figure 1A:
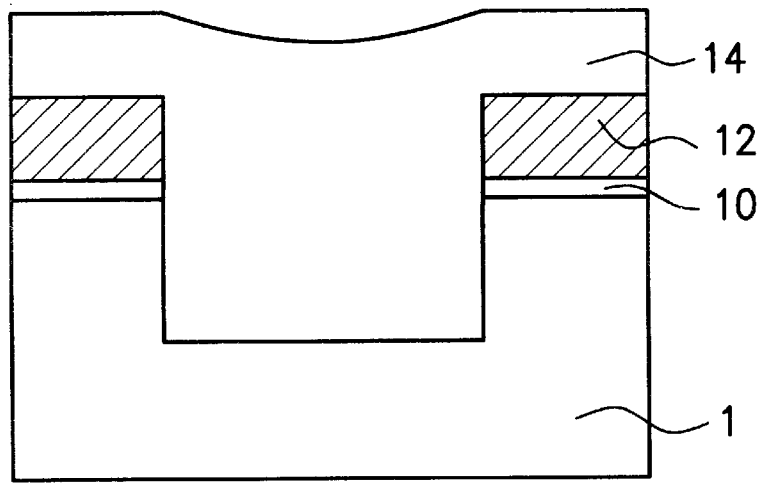
FIG. 1A–1C are cross-sectional views of the conventional shallow trench isolation structure.
Figure 1B:
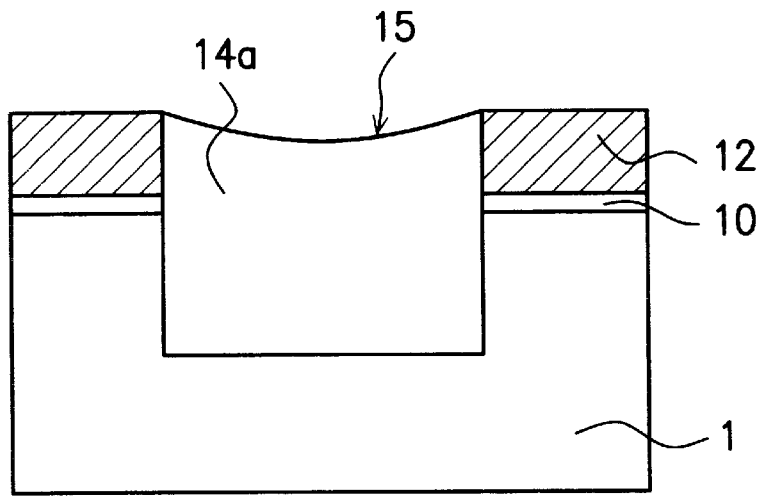
Figure 1C:
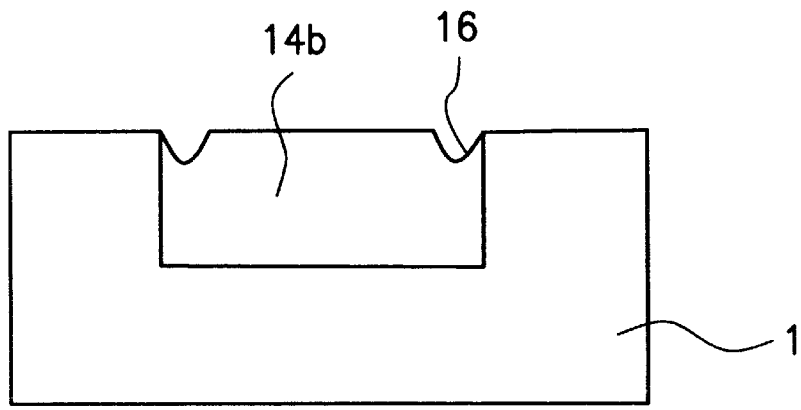
Figure 2:
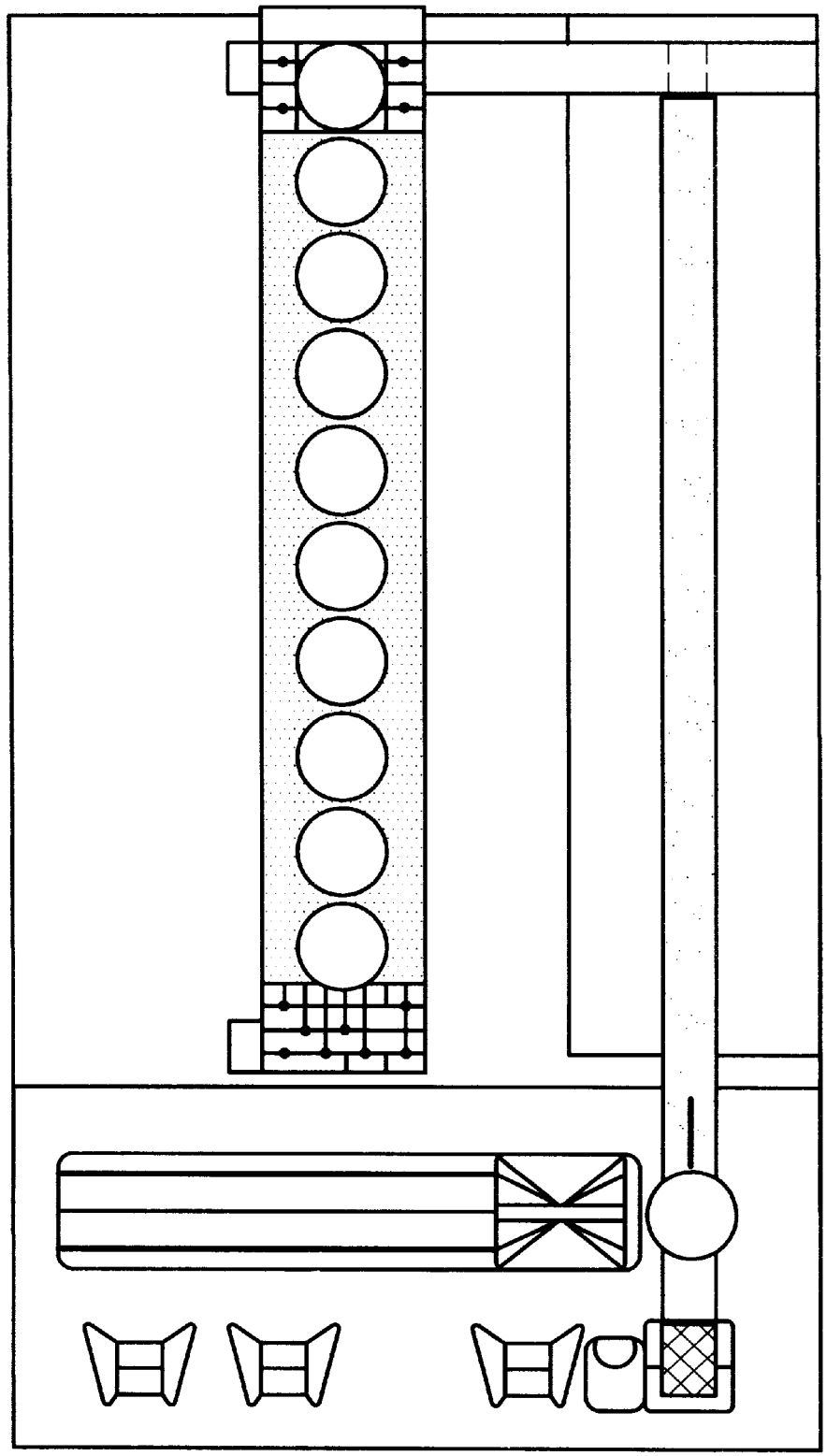
FIG. 2 is a top view of the conventional WJ-1000 or WJ-999 machine.
Figure 3A:
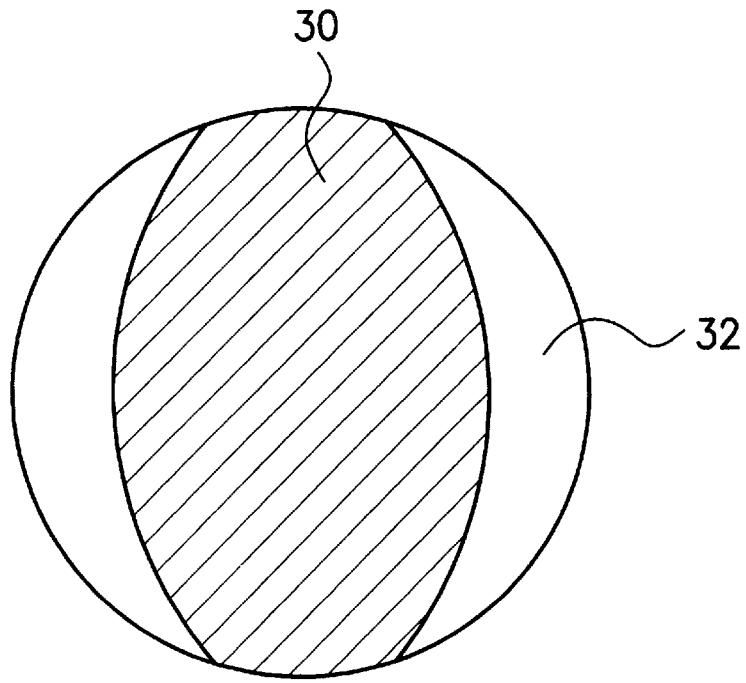
FIG. 3A shows the formation of a deposition coverage region resulting from the first deposition.
Figure 3B:
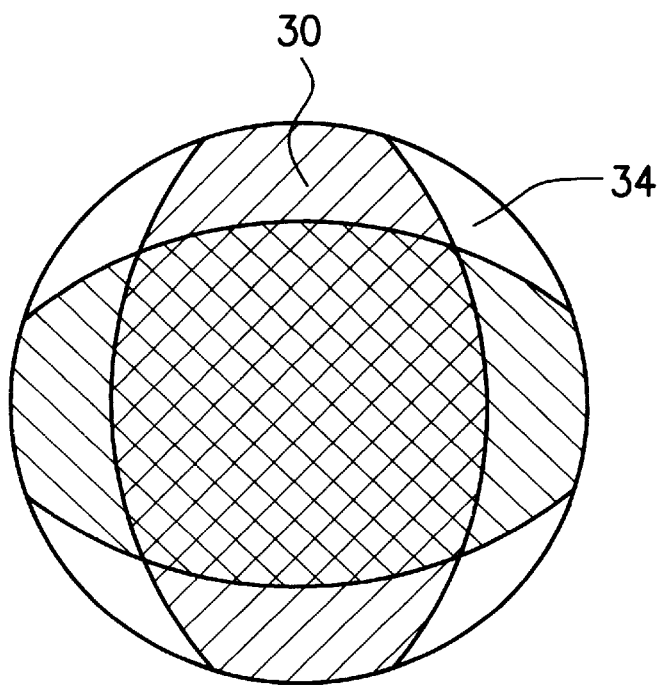
FIG. 3B shows the formation of a deposition coverage region resulting from the second deposition.
Figure 4A:
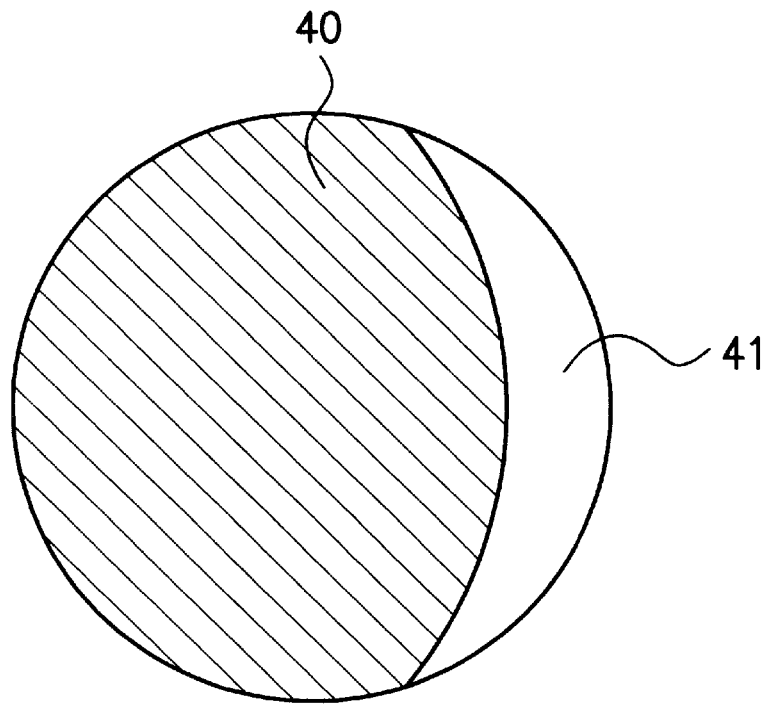
FIG. 4A–4D are cross-sectional views of the formation of deposition coverage region resulting from a 4-PASS method in a preferred embodiment according to the invention.
Figure 4B:
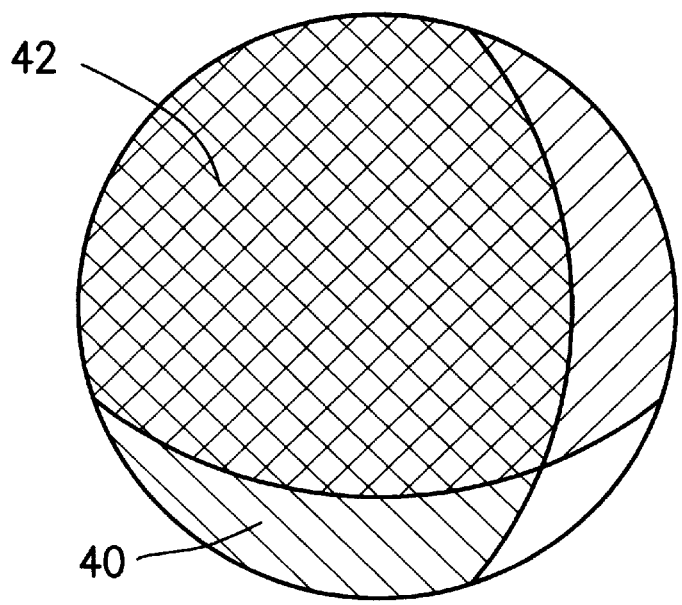
Figure 4C:
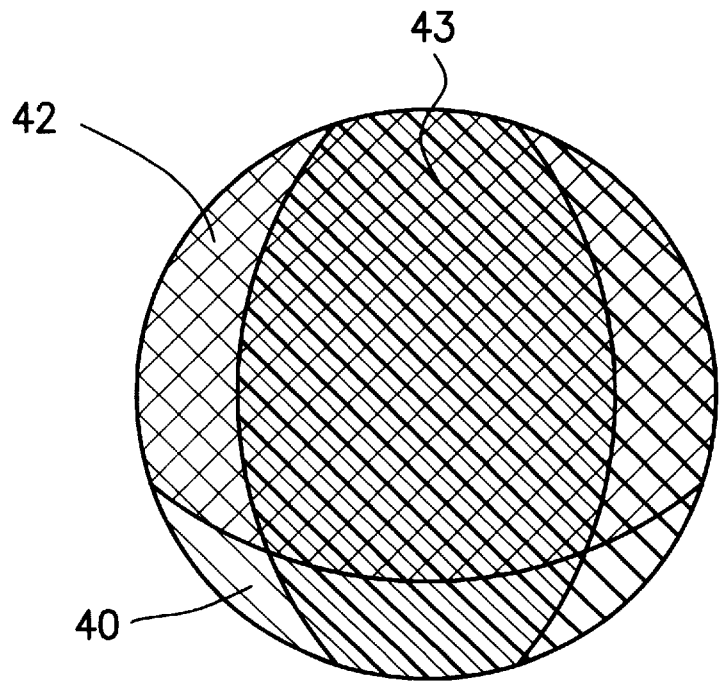
Figure 4D:
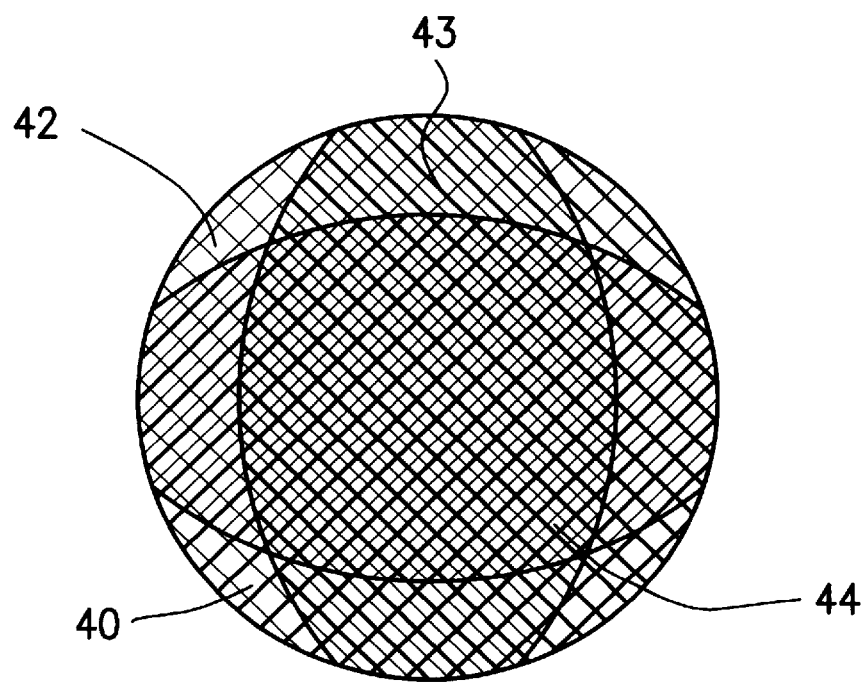

Referring to FIG. 4A, a wafer is provided an aligned on a WJ-1000 or WJ-999 machine used to perform a deposition process. The first deposition process is performed to form a first deposition layer over a portion of the wafer, so that the first deposition layer covers more than a half of the wafer, and leaving a portion of the wafer exposed. The exposed portion of the wafer resembles only a crescent as illustrated as the unshaded region as shown in FIG. 4A. After the first deposition step is carried out, the wafer is turned an angle of 90° prior to performance of the second deposition, and the result is shown in FIG. 4B. Next, the wafer is again turned an angle of 90° in the same direction and the third deposition step follows, resulting in FIG. 4C. The wafer is again turned an angle of 90° in the same direction and the forth deposition step is then performed, as shown in FIG. 4D. During the process described above, the four deposition steps are performed successively on the same wafer by the WJ-1000 or WJ-999. The deposition layer includes BPSG or PSG and the top view of the coverage region formed by the four steps is shown in FIG. 4D. The rotation of the wafer in the four deposition steps can be either clockwise or counterclockwise. After the four deposition steps, the range of the error between the maximum and the minimum thickness, as detected with 49 probes by the WJ-1000 or WJ-999 machine, is in the range of about 500–550 Å. The uniformity of the layer formed by 4-PASS step is obviously better than the uniformity of the layer deposited by 2-PASS step. As it can be seen from FIG. 4D, after each deposition step, a layer is deposited on a portion of the wafer leaving a crescent at a side of the wafer being undeposited therewith. The portion being deposited by the layer is rotated with an angle of 90°, clockwise or counterclockwise, from the previous portion being deposited. As a result, four corners of the wafer are deposited with two layers, four side regions between the corners of the wafers are deposited with three layers, and the central portion surrounded by the four side regions is deposited with four layers.

It is therefore an object of the invention to perform a 4-PASS deposition step on the wafer using the WJ-1000 or WJ-999 and selecting a deposition pattern where more than half the surface area of the wafer is covered in order to improve the uniformity of the deposited layer.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of deposition on a wafer, wherein a 4-pass deposition step is performed on a wafer to form a deposition layer, the method comprising:

performing a first deposition step on the wafer to cover a portion of the wafer, and to leave only a crescent of the wafer exposed;

performing a second deposition step on the wafer with a same coverage of the wafer as the first deposition step, except that the wafer has been rotated with an angle with 90° along a direction;

performing a third deposition step on the wafer, the third deposition step having a same coverage as the first and the second deposition steps, except that the wafer has been rotated with an angle of 90° along the direction again after the second deposition step; and performing a fourth deposition step on the wafer, the fourth deposition step having a same coverage as the first, the second and the third deposition steps except that the wafer has been further rotated with an angle of 90° along the direction after the third deposition.

2. The method according to claim 1, wherein the deposition layer includes a BPSG layer for forming a shallow trench isolation.

3. The method according to claim 1, wherein the deposition layer includes a PSG layer for forming a shallow trench isolation.

4. The method according to claim 1, wherein the deposition layer on the wafer is symmetrical.

5. The method according to claim 1, wherein an error of a maximum and a minimum thickness of the deposition layer is in a range of about 500–550 Å.

6. The method according to claim 5, wherein the error of the maximum and the minimum thickness of the deposition layer is detected with 49 probes by a WJ-1000 or WJ-999 machine.

7. The method according to claim 1, wherein the direction is clockwise.

8. The method according to claim 1 wherein the direction is counterclockwise.

9. The method according to claim 1, wherein a WJ-1000 or a WJ-999 machine is used for the deposition.

10. A method of deposition on a wafer disposed on a deposition machine, the method comprising:

performing a 4-PASS deposition process on the wafer to form four layers on the wafer, each layer leaving only one crescent of the wafer not to be deposited therewith, and each of the layer being rotated with an angle of 90° along a same direction from a previous layer, so that four corners of the wafer being deposited with two of the layers, four side regions between the corners being deposited with three of the layers, and a central portion surrounded by the four side regions of the wafer being deposited with the four layers.

11. The method according to claim 10, wherein the deposition machine includes a WJ-1000 or a WJ-999 machine.

12. The method according to claim 10, wherein the direction is clockwise.

13. The method according to claim 10, wherein the direction is counterclockwise.

14. The method according to claim 10, wherein the four layers form a deposition layer of BPSG for forming a shallow trench isolation.

15. The method according to claim 10, wherein the four layers form a deposition layer of PSG for forming a shallow trench isolation.

* * * * *